United States Patent [19]

Nichols et al.

[11] 4,299,165
[45] Nov. 10, 1981

[54] COLOR SEPARATION ORIENTATION GAUGE AND METHOD

[75] Inventors: Steven F. Nichols, Pekin; Lawrence O. Lulay, Peoria, both of Ill.

[73] Assignee: C & H Printing, Peoria, Ill.

[21] Appl. No.: 13,987

[22] Filed: Feb. 22, 1979

[51] Int. Cl.³ .................. B41F 33/00; B41F 29/08
[52] U.S. Cl. .................. 101/150; 101/181; 33/184.5; 355/4; 430/301; 434/98; 250/237 G; 356/395
[58] Field of Search .............. 35/28.3, 9; 33/184.5; 430/301, 6; 283/6; 250/237 G; 356/374, 395, 396; 355/4; 101/150, 170, 181

[56] References Cited

U.S. PATENT DOCUMENTS

| | | | |
|---|---|---|---|
| 2,165,169 | 7/1939 | Wurzburg, Jr. | 430/301 |
| 2,244,992 | 6/1941 | Gherrero | 430/301 |
| 2,703,281 | 3/1955 | Consaul et al. | 430/6 |
| 2,798,428 | 7/1957 | Tollenaar | 430/301 |
| 2,961,970 | 11/1960 | Imshang | 33/184.5 |
| 3,314,167 | 4/1967 | Allgood | 35/28.3 |
| 3,381,612 | 5/1968 | Lecha | 430/301 |
| 3,403,449 | 10/1968 | Eberlen | 33/184.5 |
| 3,939,769 | 2/1976 | Lorber | 430/301 |
| 4,012,137 | 3/1977 | Goren | 355/4 |

*Primary Examiner*—William Pieprz
*Attorney, Agent, or Firm*—Allegretti, Newitt, Witcoff & McAndrews

[57] ABSTRACT

The invention is for color separation orientation gauges and methods by which they are used to produce a finished print in more than one color, the colors used being the primary colors and black. In the printing trade, the primary colors are at times referred to as magenta, yellow, and cyan. The color magenta is basically red, cyan is basically blue and, of course, yellow is basically yellow.

The gauges utilized are provided with a predetermined number of dots disposed at various angles depending, for example, on the color to be eventually printed, which gauges are superimposed on a half-tone mask of which there are also a predetermined number of dots which are practically invisible to the naked eye. The gauges of the two embodiments of the invention are provided with special reference line dot densities and angles and legends to provide the color stripper with easy to use compact gauges for producing multi-color prints.

2 Claims, 18 Drawing Figures

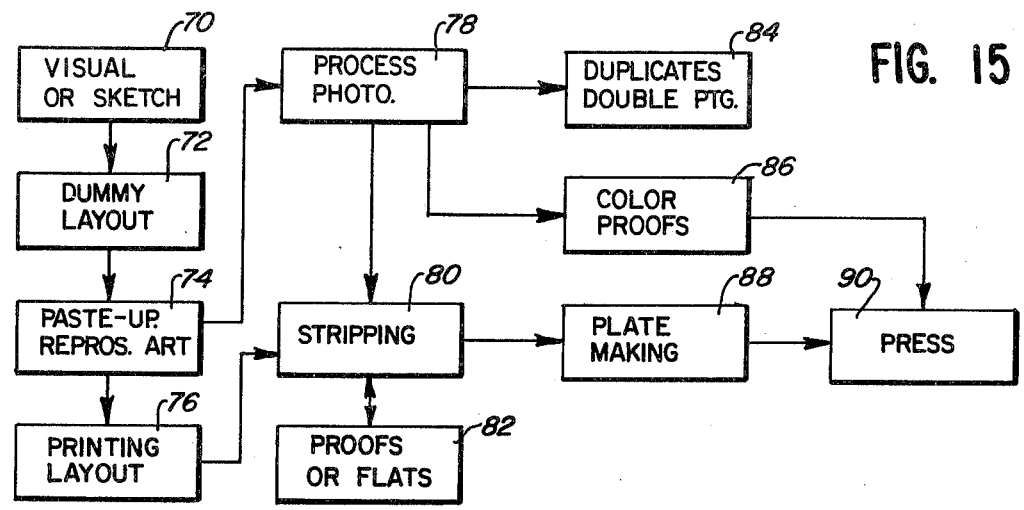
FIG. 15
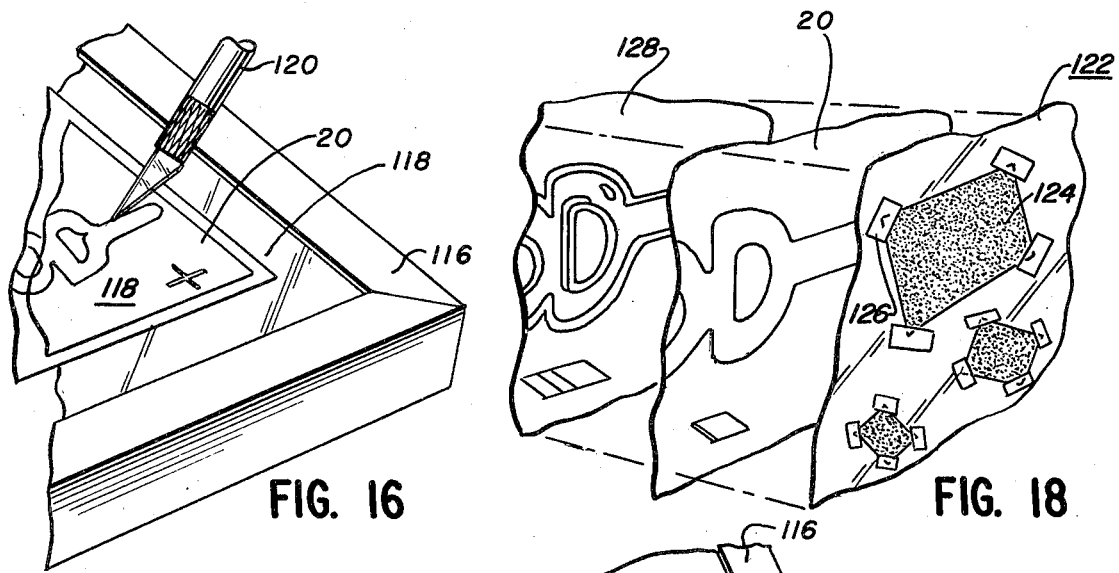
FIG. 16
FIG. 18
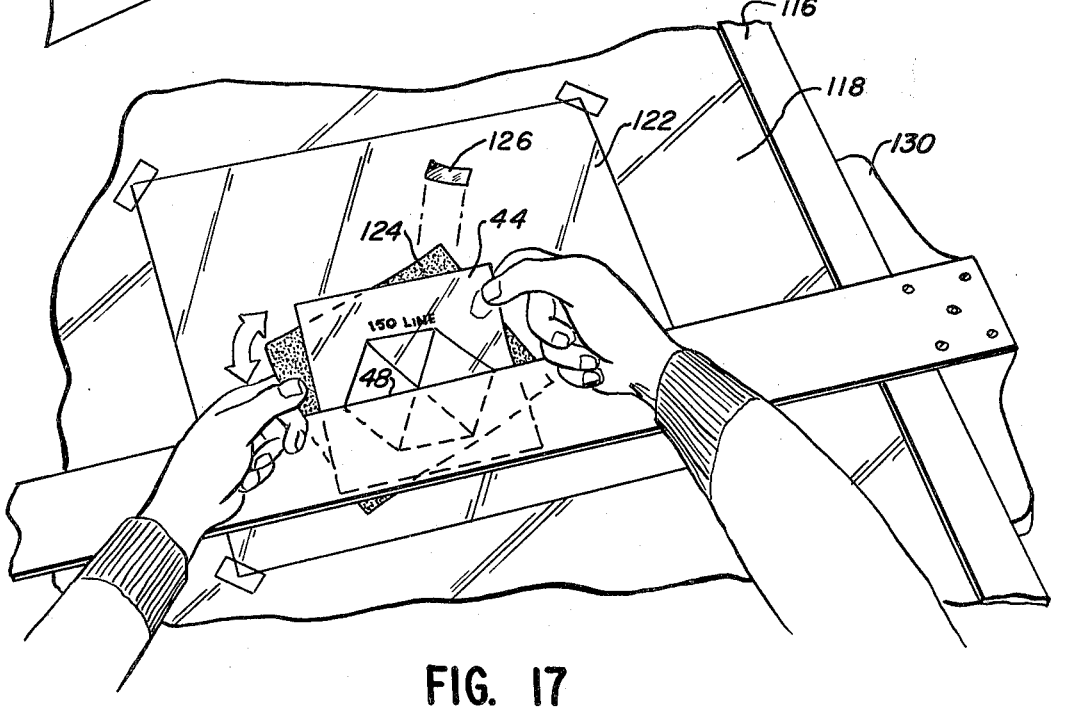
FIG. 17

COLOR SEPARATION ORIENTATION GAUGE AND METHOD

SUMMARY OF THE INVENTION

The invention relates to improved screen angle gauges used in the process of color stripping in the multiple color printing field. The gauges disclosed herein are much easier to use in the field of color stripping and provide quick and accurate results to provide the proper masks for producing the colors and tints desired in a finished printed product, which usually contain a number of colors and tints as well as black.

One of the gauges utilized in the invention comprises a number of oblong strips of material, one for each of the numbered line process strips. There may, for example, be six of such strips for the process lines which are generally used in the color printing trade. These are 65, 85, 100, 120, 133, and 150 line process strips. Each of the strips is provided with a straight horizontal reference line and four rectangular blocks, the lower edges of which are parallel to the reference line. The strips are preferably formed of mylar or a fairly heavy material which is translucent in the areas of the blocks. Four rectangular blocks are provided with various densities of dots thereon at predetermined angles with respect to the horizontal reference line and are for the colors black, magenta, yellow and cyan.

Each of the color separation positives or negatives represents the relative color densitites of the subject detail with the printing ink to be used and each of the separations are screened at a different angle, which angles are fairly standardized. Th black rectangle of each of the strips is marked with the word black and the legend 45°. The next block is marked magenta with the legend 75°. The next block is marked yellow with the legend 90°. The fourth block is marked cyan with the legend 105°.

The gauges, as well as the gauges of the second embodiment of the invention, are utilized to carry out the process known in the industry as color stripping, which is one of the steps utilized in producing a multicolored printed product such as a four color print. The gauges are used with a half-tone mask and when the mask is rotated with respect to the gauge so that no moire effect is visible, the color stripper then knows that the material he cuts off the mask will be used to produce a printing plate which will permit ink to pass therethrough of the density required for each color in order to provide various color combinations and tints. When the gauges are used for the various colors, it is obvious that no moire effect will be present for any of the colors and, therefore, no moire effect is produced in the final products regardless of how many colors or prints are superimposed over or under each other.

The second embodiment of the invention uses separate screen angle gauges, one for each of the three primary colors, namely magenta, yellow or cyan and one for black. The screen gauge for each color and for black are similar except for the angle of the dots placed thereon, and the legends for various colors and black and the angle marks corresponding respectively thereto. The screen angle gauge for each is provided with a hexagonal shaped marking on mylar or other heavy fairly stiff translucent material with lines drawn between the corners of the hexagon. The lines meet in the center of the hexagon and form six triangles. The number of dots or the dot density varies in each of the triangles and as stated the direction of the dots varies for each of the primary colors and for black. The triangles are respectively for 65, 85, 100, 120, 133 and 150 lines.

Legends are placed on the screen gauge so that when any line is in the horizontal position the number of lines of the triangle which has its flat as its outer side as one of the peripheral lines of the hexagon will read the line number of that particular triangle density. For example, if the horizontal line is in the position shown in the drawings, the 150 line triangle will be at the top of the screen angle gauge. In addition, numerals are placed on each side of lines which extend from the 6 lines of the interior of the hexagon and are likewise provided with numerals. With the triangle with the 150 line legend at the top the numerals 65 will appear on one side of the adjacent line extending from the hexagonal cross lines and the numeral 133 will appear on the other line of that triangle. Also the numeral 120 will appear opposite the numeral 65 but reversed with respect thereto and the numeral 85 will appear opposite the numeral 133 with the numeral 85 on the other side of the line but in the reverse direction. The same is true with respect to the other lines. For example, 150 appears over reversed 100, 65 appears over reversed 120 and 133 appears over reversed 85. Thus, normally does the legend, for example, 150 line appear at the top of the triangle of the screen angle gauge when the line passing through the center of the hexagon is horizontal, but the legend 150 also appears vertically at the extremities of the vertical line and this is the case with respect to each of the line numbers of the screen angle gauges.

BACKGROUND OF THE INVENTION

1. Field of the Invention. The field of the invention relates to color stripping gauges for the eventual printing of up to four colors including black on a finished product, usually on a four color offset lithograph printing press.

2. Description of the Prior Art. Screen angle gauges have been used for color stripping and multi-color printing and a number of different types of gauges are known. One such gauge is shown in the present application at FIG. 13. However, all of the prior art gauges which have been used to the best of our knowledge have definite deficiencies and disadvantages which are overcome by the gauges of the present invention.

BRIEF DESCRIPTION OF THE DRAWING

FIG. 15 is a block diagram showing the flow of a four color or multicolor printing process including the color stripping step;

FIG. 16 is a partial perspective view of a step in the color stripping process wherein a knife is being utilized to form the cutouts.

FIG. 17 is a perspective view of a portion of a table which is utilized during the operation of providing various flats for use eventually in the color printing process showing also the utilization of one of the gauges of the second embodiment of the invention; and FIG. 18 is a partial perspective view of a negative, a mask and a flat shown in the positions they are placed during the process which eventually results in a multicolored product, the flat showing pieces of the half-tone mask in the proper positions.

DESCRIPTION OF THE PREFERRED EMBODIMENT

Figure 1:
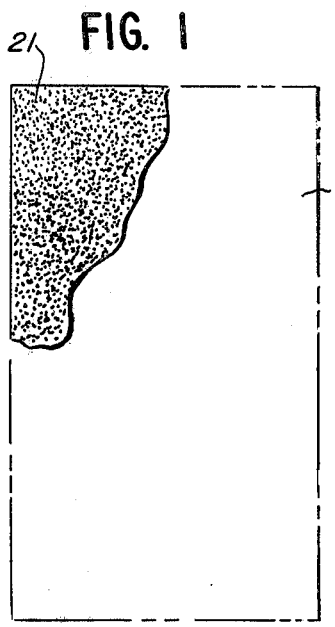
FIG. 1 is a plane view of a half-tone mask having a predetermined number of dots thereon which are shown on a portion of the figure.

A half-tone mask of a specific dot or line size, i.e., 133 for example, is shown in FIG. 1 and is provided with a plurality of equally spaced dots 21 throughout its surface. The mask is formed of a translucent relatively thin film of plastic material such as, for example, mylar, which may be readily cut into desired shapes with a sharp instrument.

Figure 2:
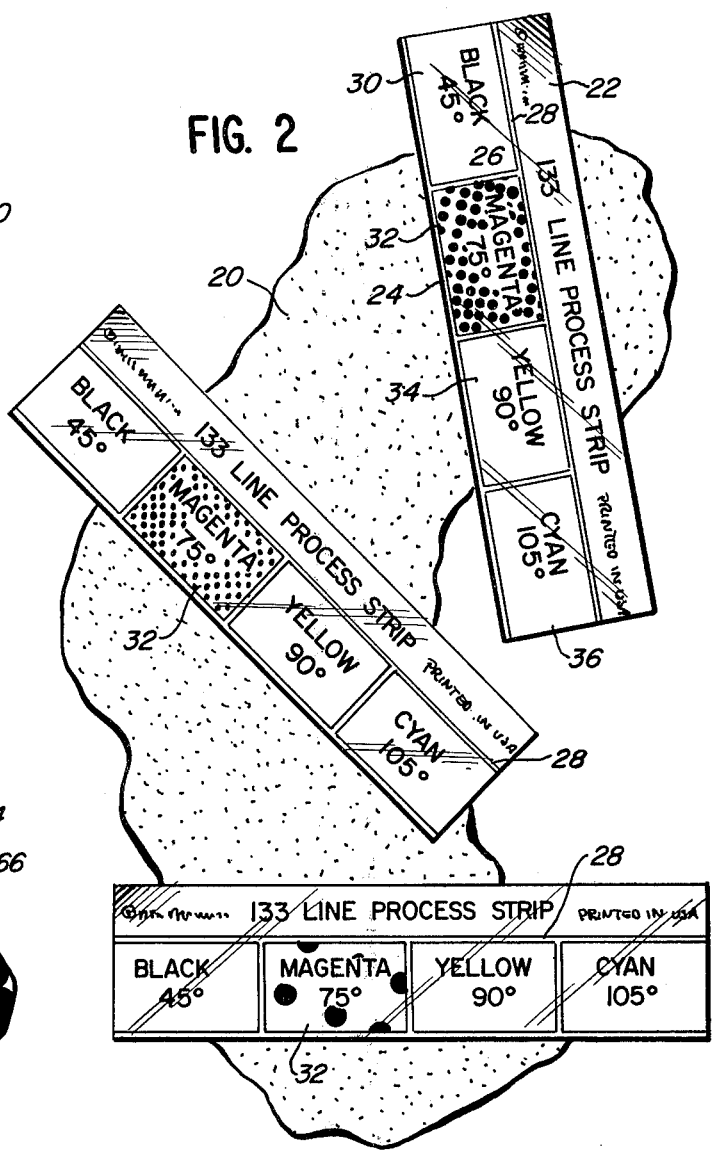
FIG. 2 is a view of a 133 line process strip used in practicing the invention shown in three positions superimposed on the half-tone mask and illustrating the appearances of the moire pattern for the color magenta in those three positions.

FIG. 2 shows a 133 line process strip 22 in three separate positions on the half-tone mask 20. Any one of the line process strips may be utilized depending on the density of the ink which is to be placed on the finished product. The line process strips each have a fairly heavy straight base line 24 and are divided into four rectangles by lines 26 extending at right angles to the line 24 and being provided with a top line or pair of lines 28. One of the rectangles numbered 30 is for black and has the legend "black" thereon together with the lettering "45°". The second rectangle 32 is for magenta and has the word "magenta" thereon with the numeral "75°". A third rectangle 34 has the legend "yellow" thereon with the numeral "90°". A fourth rectangle 36 marked "cyan" has the numeral "105°" thereon.

As shown in FIG. 2, when the strip 30 is rotated relative to the mask 20, the pattern which becomes visible to the naked eye for the color magenta for example, changes considerably. In the position of the strip shown at the upper right-hand side of the figure the appearance under the rectangle mark 32 for magenta shows a pattern of rectangles. The same rectangle 32, when rotated to the position shown in the middle of FIG. 2, shows a smaller rectangular pattern which is approaching the pattern desired where no moire effect is visible to the naked eye and in other words the rectangles substantially disappear. The third strip with the magenta rectangle 32 shown at the bottom of FIG. 2 illustrates a very prominent moire effect showing that the position of the strip on the material 20 is improper for obtaining the desired moire effect which is utilized to cut out the portion of the material 20 which is eventually used in the process. As stated, no moire effect should appear for any of the colors.

Figure 3:
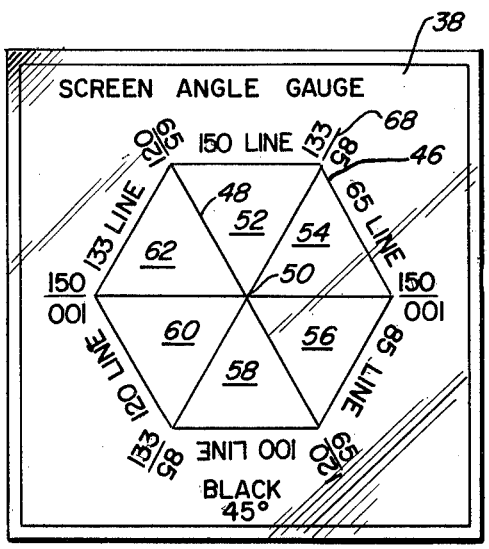
FIG. 3 is a partial enlarged view of the dots which are applied to the screen angle gauges shown in FIGS. 4-7.
Figures 4, 5:
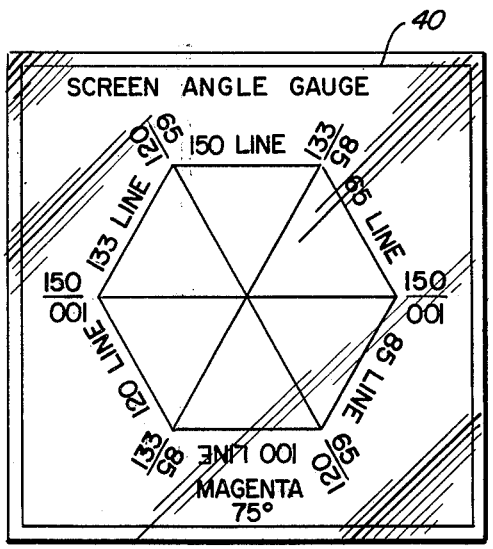
FIGS. 4-7 are plane views of four screen angle gauges made in accordance with a second embodiment of the invention, FIG. 4 showing the gauge for the color black, FIG. 5 for the color magenta, FIG. 6 for the color cyan and FIG. 7 for the color yellow.
Figure 6:
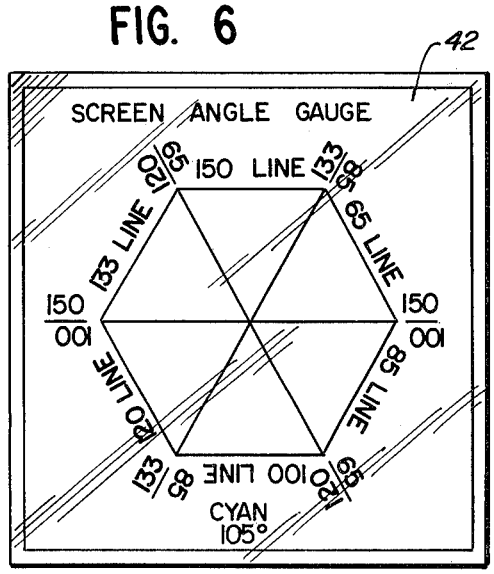
Figure 7:
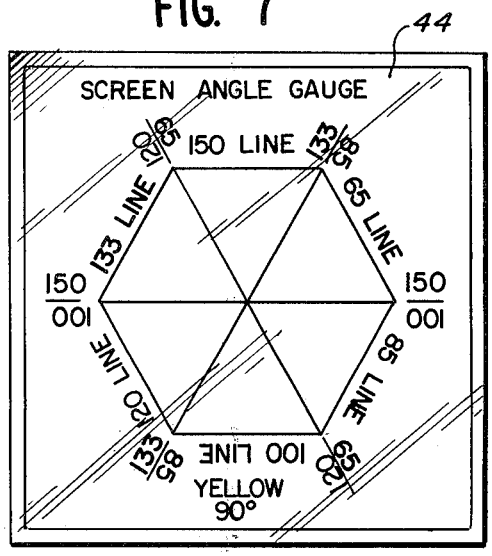

FIGS. 3-7 discloses the second embodiment of the invention. FIGS. 4, 5, 6, and 7 show rectangular films of plastic material such as mylar for the three primary colors and black. The gauge shown in FIG. 4 is marked with the numeral 38, that shown in FIG. 5 with the numeral 40, that shown in FIG. 6 with the numeral 42, and that shown in FIG. 7 with the numeral 44. The gauge shown at 38 is for black. The gauge shown at 40 is for magenta. The gauge shown at 42 is for cyan, and the gauge shown in FIG. 7 is for yellow, which colors are printed or marked on the respective gauges.

Each one of the gauges is provided with a hexagonal outline 46 which has lines 48 drawn between the corners of the hexagon which meet at the center as shown by the numeral 50 and form triangles 52, 54, 56, 58, 60 and 62 starting in a clockwise direction from the 150 line shown at the top of each of the screen angle gauges in the position illustrated in FIGS. 3-7.

As best shown in FIG. 3, each of the triangles has a number of different size dots superimposed thereon which dots are visible either to the naked eye or under slight magnification. For example, the dots in the triangle 52 under the 150 line are shown at 64 and have 150 dots per square inch in that area. Dots 66 shown in triangles 54 are the 65 line dots, in other words, there are 65 dots per square inch in triangle 54. Likewise, in triangle 56 the dot density is 85 per square inch. In triangle 58 the dot density is 100 per square inch. In triangle 60 the dot density is 120 per square inch, and in triangle 62 the dot density is 133 per square inch.

Referring again to FIGS. 4-7 it is noted that the respective triangles in each of the gauges have legends at the peripheral edge of the triangle which read 65 line, 85 line, 100 line, 120 line, 133 line and 150 line. In addition, numerals are placed on opposite sides of extensions 68 of the lines 48 and are positioned so that when the peripheral boundary of any of the triangles is positioned so that the legend above it is horizontal the same number appears at the opposite ends of the line 48 which is then disposed horizontally.

Referring to FIG. 15 which is a flow diagram, the process starts with block 70 for a visual subject detail. The next step is "dummy layout" block 72 and the next step is "reprose art" and is marked with the numeral 74. The next block marked 76 depicts the "printing layout" and block 78 denotes the "process photo". The flow lines extend from the block 70 to block 72, to block 74, and to block 76. Flow lines also extend between block 74 and 78 and 76 and the block mark 80 denoted "stripping". Block 82 is marked "proofs or flats". Block 84 shows "double ptg" (printing), block 86 "color proofs", block 88 "plate making", and block 90 "press".

It is noted that flow lines extend from block 78 to blocks 80, 84 and 86 and flow lines extend from block 80 to block 82 and 88. Also, that a flow line extends from "color proofs" block 86 to block 90 "press" and from block 88 "platemaking" to block 90 "press". FIG. 15 therefore, shows the flow of the process from the beginning sketch 70 to the press 90 wherein multicolored products are printed.

FIGS. 8-11 inclusive show one portion of a finished product and illustrate both the configuration and colors which are on the printing plate on the rotating press cylinder and also the colors which appear on the individual final sheets as they pass through the various color rollers of the printing press. The details of the four color printing press are not shown since they are well known in the art. Four color printing presses have four stations or steps where the three primary color inks are fed to the printing plates on the plate roller and black is fed to a printing plate on a fourth printing roller.

Referring further to FIGS. 8-11, FIG. 8 shows a portion 92 of a stylized letter O with a white center portion 94. Numeral 96 shows a stylized portion of a letter D which is white at this point with a center 98 which is black. The surrounding background 100 is also black.

Figure 8:
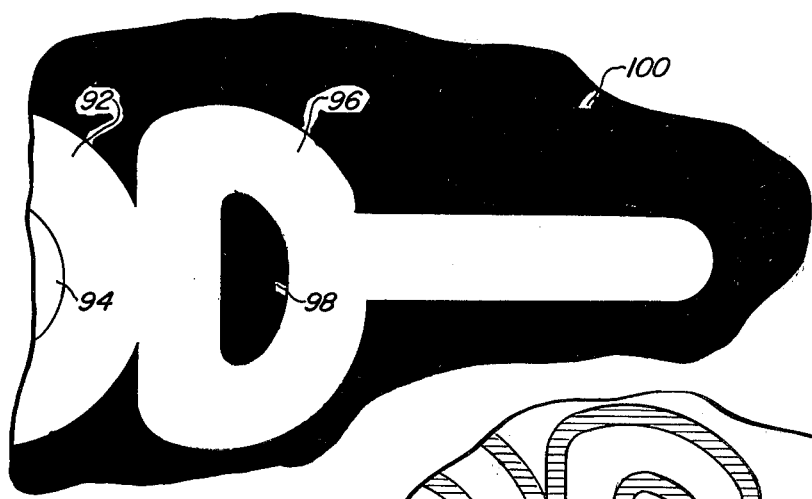
FIG. 8 is a portion of a four color print showing the extent of the black areas.
Figure 9:
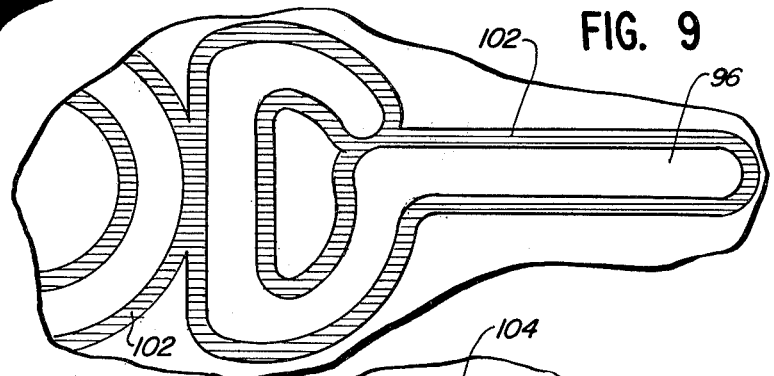
FIG. 9 is a view similar to FIG. 8 showing the color cyan applied to the same portion of the finished product as shown in FIG. 8.

FIG. 9 shows the same stylized letters O and D but in this case the outline of the letters are shown at 102 and are cyan with the white portion of the letter D shown at 96 corresponding to the same area in FIG. 8.

Figure 10:
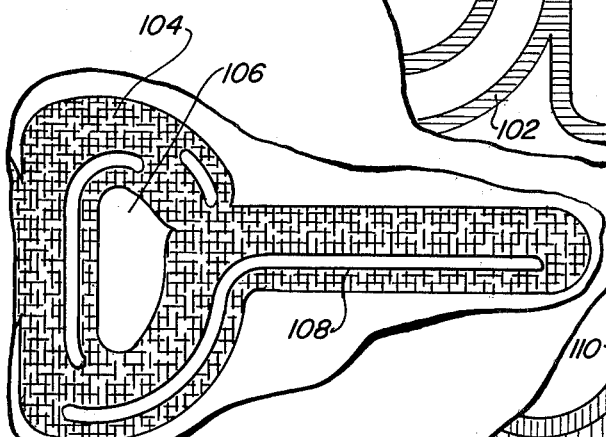
FIG. 10 is a similar view showing the application of the color yellow to a similar portion of the finished work such as shown in FIG. 8.

FIG. 10 shows the stylized letter D wherein portions 104 are shown in yellow and the interior portion of the letter D shown at 106 as well as the double lines 108 are now in white.

Figure 11:
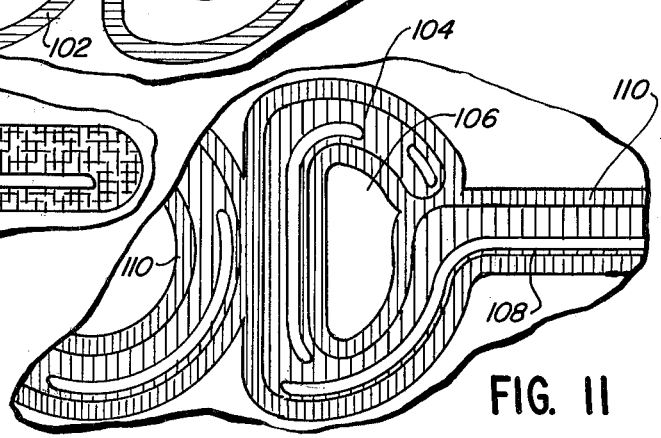
FIG. 11 is a similar view showing the application of the color magenta to the portion of the finished product shown in FIG. 8.

FIG. 11 shows the stylized letters O and D with the color magenta shown at 110 with the same portions 106 and 108 shown in white as in FIG. 10 and the other portions shown at 104 in yellow, which yellow color is changed to a somewhat orange color because of its superimposition upon the magenta portions of the letters.

Figure 12:
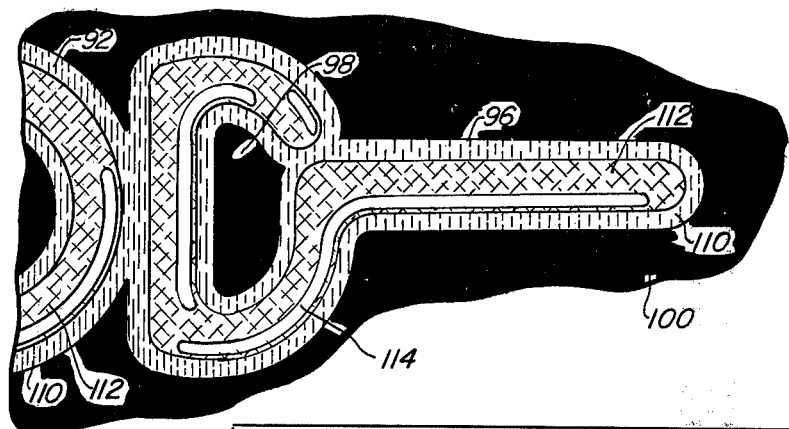
FIG. 12 is a view of the portion of the finished product shown in FIGS. 8-11 with all the colors thereon including the various tints and illustrating those portions which are black or white.

FIG. 12 shows the stylized letters O and D as 92 and 96 respectively and illustrates the colors of the letters when all of the different colors are combined on the finished product. The background color 100 is black as is the center 98 of the D. The outer periphery of the letters shown at 110 are violet and the center portions of the letters shown at 112 are orange. The slots shown at 114 are still white.

Figure 14:
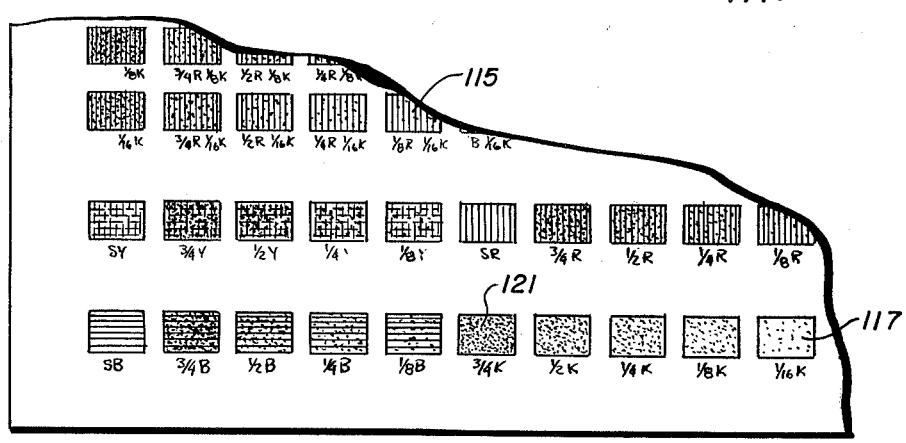
FIG. 14 is a partial view of a color chart used in the printing trade showing the percentage of various primary colors or black which result in the tints required on the finished product and which provides a guide for the line numbers used on the screen angle gauges to obtain the required color or tint on the finished product.

FIG. 14 discloses a portion of a color chart which is used by printers and contains a large number of rectangular colors shown at 115. The letter Y represents yellow, the letter R magenta, the letter B represents blue and the letter K represents black. The percentages of each of the colors is shown on each of the squares when the proper percentage of colors shown are utilized, the color or tints thereof which are shown on the color chart will be reproduced. In order to obtain the percentages of colors or black desired it is necessary to use screens which produce printing plates which permit different amounts of ink to pass therethrough. If, for example, a very light gray is desired the rectangle marked 117 in FIG. 14 illustrates that the value should be 1/16 black which means that the screen utilizing a large or heavy dot density would be employed, namely, one having, for example, the 150 line dots. On the other hand, if a very dark gray is required as shown, for example, in rectangle 121, a ¾ black is required and the 65 line density would be utilized which when translated to the printing plate on the press will permit more black ink to pass therethrough and be eventually printed on the finished product. The customer decides what colors are desired for various parts of a color print, and by utilizing the color chart shown in part in FIG. 14 the printer is able to produce substantially the exact tint required.

As stated, FIGS. 16, 17 and 18 show the use of a screen angle gauge and show the steps which are followed in order to obtain a negative (or positive) for one of the colors, for example, yellow.

The mask 20 is first placed on a standard table 116 which usually has a plate glass surface 118 thereon upon which the mask 20 is disposed with some means for maintaining it in position once it is placed upon the glass 118. Thereafter, a knife 120 is utilized to cut the stylized letters O, D from the mask 20.

A flat 122 with portions 124 of the half-tone material that may be secured thereto by light transmitting pieces of adhesive 126 is positioned over the cut mask 20. Assuming that the yellow color negative 128 is being produced, the color stripper, places the flat 122 in position lines up one of the lines 48 on the yellow screen angle gauge 44 by use of a T square 130, and then rotates the half-tone material 124 until the moire pattern disappears for the density and for the line number which he is observing which for illustrative purposes has been shown as the 150 line mark. The half tone material 124 is then adhesively secured to the flat in that position by the adhesive material 126 as described heretofore. The negative 128, the mask 116 and the flat 122 are then placed together usually by standard vacuum equipment and the proper light is utilized to expose the negative 128 to produce the desired half tone, color print design thereon. Each portion of the design will have dots of the desired density thereon so that the desired amount of ink of a particular color will pass through printing plate (not shown) which is eventually produced from the negative 128.

Figure 13:
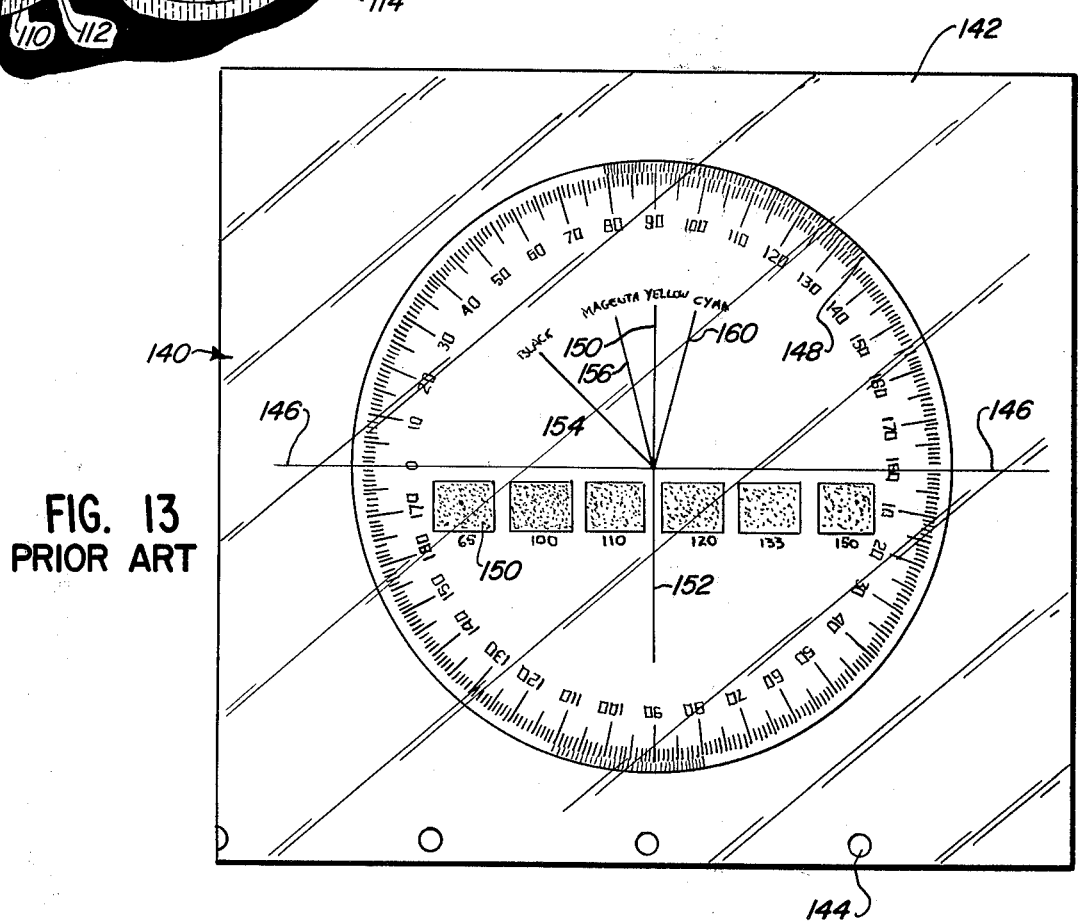
FIG. 13 is one of the screen angle gauges which has been utilized in the prior art.

Referring to FIG. 13, a prior art screen angle gauge is shown at 140 and includes a rectangular piece of translucent material 142 formed of mylar or the like. The gauge has peg holes 144 provided thereon to hold the gauge in position when in use. It is noted that the gauge 140 has a horizontal line 142 provided thereon substantially central of the vertical height of the gauge. A scale in degrees is positioned centrally of the gauge and is generally indicated by the numeral 148. The scale starts at the left hand of the horizontal line 146 at 0° and is marked in single degrees for a part thereof and in half degrees for another part thereof until it reaches 180° which is at the right-hand end of the horizontal line 146. The half degree graduations are between 80° and 135° at the upper side of the scale. The bottom of the scale starts with 0° at the right-hand side of line 146 and extends and is marked up to 180° at the left-hand end of line 146. This portion of the gauge is likewise marked in one degree increments, except that between 80° and 110° it is marked in one-half degree increments.

Positioned below the center line 146 within the circular markings are a plurality of squares 150 which have different density dots therein, the squares being marked with the numerals 65, 100, 110, 120, 133 and 150. The interior of the gauge is provided with a vertical line passing through the 90° axis thereof which is marked with the color "yellow" and is given numeral 150. Another line 154 is marked "black" and is at the 45° line of the upper scale. Another line 156 is marked "magenta" and extends from the center of the circle at an angle of 75°. Another line 160 marked "cyan" extends from the center of the circle upwardly at an angle of 105°. It is noted that the value of the angles of the lines 154, 156, 158 and 160 are the same as the standard degrees shown in FIG. 2 which illustrates the first embodiment of this invention and in FIGS. 4-7 which illustrate the second embodiment of the present invention. One disadvantage of the gauge shown in FIG. 13 is that it is secured in position by pegs (not shown) extending through the holes 144 and therefore is not readily movable when in use whereas, the gauges of the present invention may be moved to any desired position and properly aligned by use of a T-square. Furthermore, the portions of the gauge showing the various values of lines are not movable and, therefore, it is necessary to unduly manipulate the material which is to be secured to the flat in order to obtain moire indications.

It will be apparent from the foregoing that both embodiments of the present invention have substantial advantages over a gauge such as that shown in FIG. 13 and provide for ease of manipulation in order to obtain the desired moire indications for various colors and densities. Moreover, the gauges are relatively inexpensive to produce and are very compact particularly of those illustrated in the first embodiment of the invention.

What is claimed is:

1. A screen angle gauge for use in color printing comprising a strip of translucent relatively rigid material, a straight horizontal reference line inscribed on said material, four separate areas, each area containing the same predetermined number of opaque half tone dots per square inch, each area separately formed on said material, each area having said dots in alignment at different angles to said reference line in accordance with the moire pattern associated with the colors magenta, cyan, yellow and black, a legend for each of said areas denoting the associated color, and a legend for each area denoting the different angle from the horizontal associated with each of the colors, and defining means for the gauge to be aligned with the horizontal reference line on a half tone color separation of predetermined half tone dot size for any of the colors magenta, cyan, yellow and black.

2. A screen angle half tone print gauge for color separation for a single color from the group including magenta, cyan, yellow and black comprising a series of six separate half tone dot patterns arranged in a hexagonal outline placed on a translucent material, solid lines placed on said material connecting the corners of the hexagon and meeting at the center thereof to divide the hexagon into said six separate triangular areas of equal size and shape with six differently positioned peripheries, the opaque dots in each of the six areas being at the same angle with respect to one of the six lines in accordance with the color from the group for which the gauge is used, inscribing six numerical legends at the peripheral portion of each triangle denoting the number of lines of dots in that triangle and placing legends in alignment with each of the other two lines forming each triangle which meet at the center of the hexagon so that when such a line is placed in a horizontal position, it shows the same dot legend intensity as the aforesaid legend, both of said legends reading in an upright position, saud gauge defining means for alignment with a horizontal reference line on a half tone color separation for only one of the colors from the group and for all of the half tone sizes of the gauge.

* * * * *